United States Patent [19]

Record

[11] 4,401,351
[45] Aug. 30, 1983

[54] EXPANDABLE CARD CAGE

[75] Inventor: Grant C. Record, Palo Alto, Calif.

[73] Assignee: Advant Corporation, San Jose, Calif.

[21] Appl. No.: 305,940

[22] Filed: Sep. 28, 1981

[51] Int. Cl.³ .............................................. H05K 1/14
[52] U.S. Cl. ........................... 339/17 LM; 339/17 M; 339/17 N; 361/393; 361/395; 361/415
[58] Field of Search .................. 211/41; 361/415, 393, 361/395, 383, 384, 413; 339/17 LC, 17 M, 17 LM, 17 F, 17 N, 176 MF; 361/394

[56] References Cited

U.S. PATENT DOCUMENTS

| | | | |
|---|---|---|---|
| B 404,290 | 1/1975 | Friend | 339/17 M |
| 3,450,950 | 6/1969 | Tarrats | 361/415 |
| 3,573,558 | 4/1971 | Babcock | 361/415 X |
| 4,122,508 | 10/1978 | Rumbaugh | 361/415 X |

*Primary Examiner*—Mark Rosenbaum
*Attorney, Agent, or Firm*—Limbach, Limbach & Sutton

[57] ABSTRACT

The subject invention relates to a expandable modular system for electrically interconnecting any number of printed circuit boards to a composite motherboard. The motherboard serves as a common connection for transmitting signals to all the printed circuit boards. The subject system includes a support module adapted to hold a fixed number of individual printed circuit boards. A motherboard is mounted within each support module and includes connectors to interface with the printed circuit boards. An electrical coupler is provided which is adapted to link the motherboard of one module to the motherboard of another module. In use, the desired number of printed circuit boards are mounted in a sufficient number of support modules. The couplers are used to electrically link the motherboards of each module in series such that the combination of motherboards and couplers define the composite motherboard. Preferably, each support module includes its own power supply and cooling system. Additional printed circuit boards may be added to a computer system merely by interconnecting additional support modules. In one preferred embodiment, the coupler is designed to permit the support modules to be physically separated thereby reducing heat concentrations and permitting greater flexibility in the design of the shape and size of the computer.

11 Claims, 4 Drawing Figures

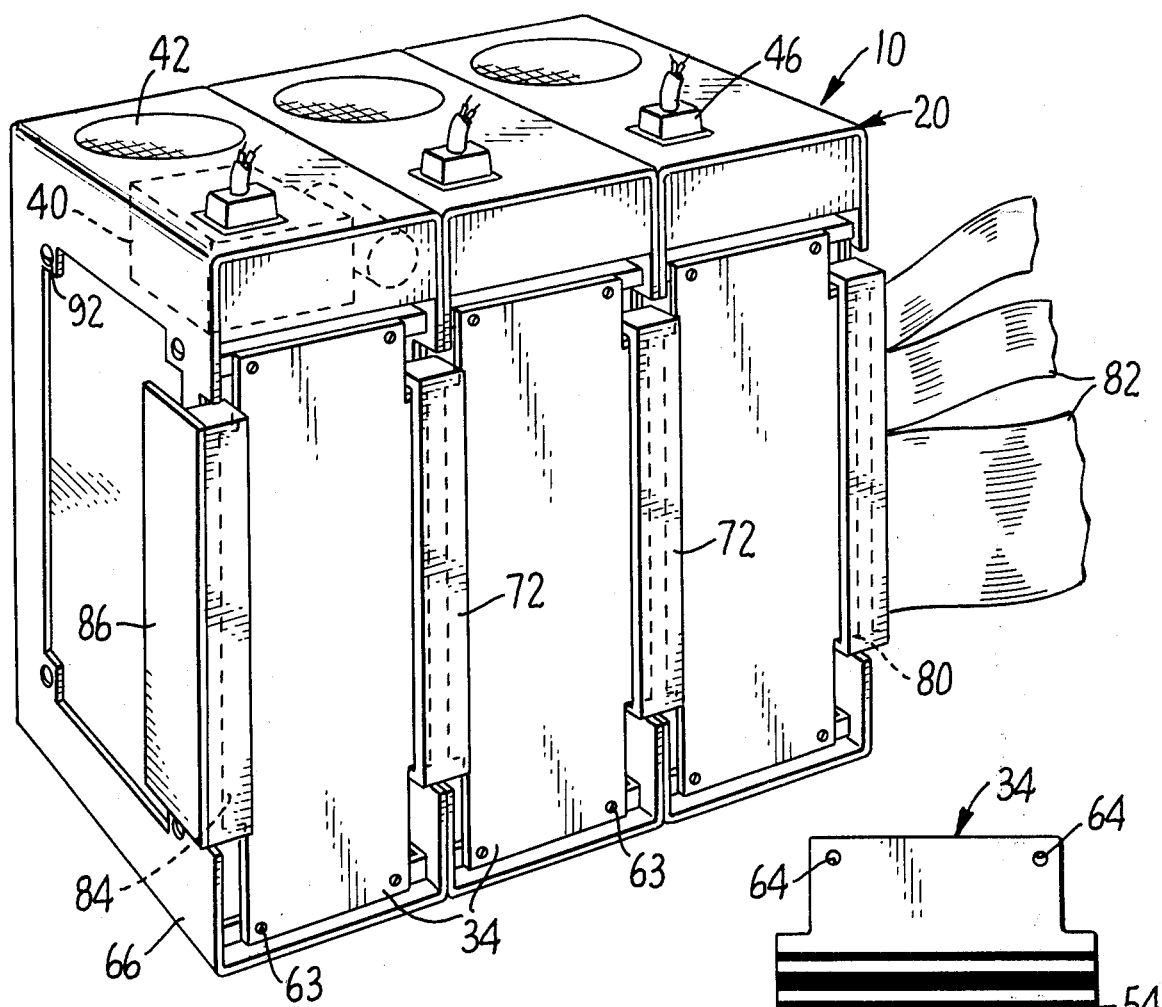
FIG. 2.
FIG. 3.
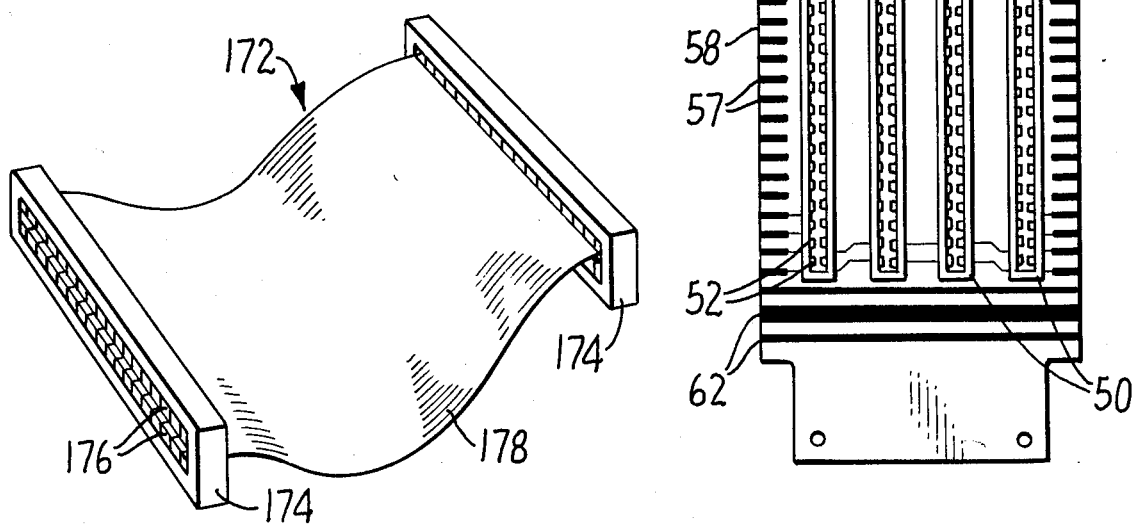
FIG. 4.

EXPANDABLE CARD CAGE

BACKGROUND OF THE INVENTION

The subject invention relates to a modular system for electrically interconnecting any number of printed circuit boards to a composite motherboard. More particularly, in digital computer systems, a motherboard is provided which serves as a common connection for transmitting signals to a plurality of printed circuit boards. The subject invention permits additional printed circuit boards to be readily added to the system without having to redesign components such as the power supply and cooling system as well as the motherboard itself.

The development of a new computer takes a significant period of time and is relatively costly. First, the internal circuitry must be designed based on the intended usage of the machine. Once the necessary circuitry has been formulated, a considerble amount of work is necessary to develop the proper configuration of the hardware components. For example, a plurality of printed circuit boards are designed carrying the components capable of performing the logic functions dictated by the circuitry.

In most systems, a motherboard or bus is provided which serves as a common connection for the printed circuit boards. In use, the motherboard is connected to the input/output system of the computer and functions to transmit signals between the I/O devices and each of the printed circuit boards. Accordingly, each of the printed circuits boards must be electronically interconnected to the motherboard.

In the prior art, the latter requirement limits the possible design configurations of the system. More specifically, when the unit is physically planned, all the printed circuit boards and the connected motherboard must be grouped in a particular location in the housing of the computer. In some situations this lack of design flexibility is a serious shortcoming. For example, when all of the printed circuit boards must be clustered in one area, problems associated with heat generation are increased. As can be appreciated, when many active components are situated in one location, large and complex cooling systems must be provided to prevent the overheating and breakdown of components.

Another shortcoming relates to the design configuration of the computer itself. For example, frequently a computer is developed to automate machinery. To permit convenient interfacing, it is often necessary to design the dimensions of the shell or housing of the computer to fit in a defined area associated with the machinery. Thus, the shape of the housing is dictated by its surroundings rather than by the functional requirements of its intelligence. In addition, the shape of the housing is a concern when designing small business and home computers since the appearance of the unit will affect its marketability. Thus, it would be desirable to reduce the design constraints imposed by the prior art printed circuit board and unitary motherboard combination, to permit greater flexibility in shaping the dimensions of the computer housing and the layout of the hardware.

Once the design of a computer has been completed, units are manufactured and distributed to customers. Typically, once the computer has been subject to a certain amount of field use, the manufacturer will receive various comments and suggestions for improvements which would make the device more attractive to consumers. Some of these suggestions merely require relatively minor modifications to the existing computer in order to implement the change. However, many of the suggestions relate to various functions which the system is either incapable of accomplishing or does not perform adequately.

To improve and expand the capabilities of the system, it often becomes necessary to design additional circuitry. Usually, the actual design work needed to devise the new circuitry, to provide an added function, is not extremely difficult or expensive. However, in order to incorporate the new circuitry in the computer, it is often necessary to completely redesign the internal hardware and support systems. More particularly, to provide enhanced computing power, it is frequently necessary to add additional printed circuit boards to the computer. In the prior art, this necessitated the redesign of the motherboard to accept the additional printed circuit boards. The latter requirement frequently proves too costly to justify its implementation. For example, in the initial design, the space in the housing provided for the motherboard and printed circuit board package may not have been sufficient to accommodate additional printed circuit boards. In addition, since the new printed circuit boards require added power, new, larger power supply systems must be designed. Further, since the additional printed circuit boards will generate heat, an improved cooling system must be provided. Accordingly, even though the circuitry needed to improve the system can be developed with relatively little cost, the addition of the circuits to the system can be prohibitively expensive. Therefore it would be desirable to provide a new and improved system which readily permits the addition of printed circuit boards to a computer when desired.

SUMMARY OF THE INVENTION

Accordingly, it is an object of the subject invention to provide a new and improved modular system for electrically interconnecting any number of printed circuit boards to a composite motherboard.

It is another object of the subject invention to provide a new and improved modular system which facilitates design changes that include an increase in the number of printed circuit boards.

It is a further object of the subject invention to provide a support module including a new and improved motherboard which is connectable to a motherboard in a similar support module to define a composite motherboard circuit.

It is still another object of the subject invention to provide a modular system including new and improved support modules which may be both physically separated and yet electrically interconnected to define a composite motherboard thereby permitting greater flexibility in the design of computer configurations.

In accordance with these and many other objects the subject invention provides for an improved modular system for interconnecting any number of printed circuit boards to a composite motherboard. As in the prior art, the motherboard serves as a common connection for all the printed circuit boards.

In the subject invention, a support module is provided which is adapted to hold a fixed number of individual printed circuit boards. Preferably board guides or tracks are provided for mounting the printed circuit boards in a parallel array. Each support module is provided with a unique motherboard having a plurality of connectors for interfacing with the printed circuit boards of that module. In accordance with the subject invention, an opposed pair of side edges of the motherboard are provided with a connector means configured to permit the expansion of the motherboard. Preferably, the connector means includes a plurality of conductive elements located along the side edge of the board in a spaced, comb-like array to define a male connector.

A coupling means is provided, adapted to link the motherboard of one support module to the motherboard of another module. The coupling means includes a pair of electrically interconnected female connectors which are configured to mate with the comb-like male connectors of the motherboard.

In use, a sufficient number of support modules are provided to accommodate the desired number of printed circuit boards. The printed circuit boards are interfaced with the motherboard housed within the respective support module. All the printed circuit boards may then be electrically linked by utilizing a sufficient number of the coupling means to interconnect the motherboards of each respective support module in series. By this arrangement, the combination of the motherboards and coupling means defines a composite motherboard which serves as a common connection for all the printed circuit boards.

In the preferred embodiment of the subject invention, each support module is provided with its own power supply and cooling system. By this arrangement, changes which require the addition of printed circuit boards and extra support modules, in order to enhance the capabilities of a computer, are relatively simple. More particularly, additional printed circuit boards and support modules may be added without the manufacturer having to redesign hardware configurations as well as the power supplies and cooling systems. For example, if a design improvement requires the addition of a number of printed circuit boards, a new module can be linked into the system. The additional circuit boards are interfaced with the motherboard of the new support module. Utilizing the coupling means, the new support module is linked in series with the support modules already provided in the computer. Thus, in accordance with the subject invention, the motherboard housed within the new support module is incorporated into the composite motherboard of the system. Since the new support module is provided with its own power supply and cooling systems, it is unnecessary to redesign these systems as required in the prior art.

Another advantage of the subject invention relates to the design flexibility which can be achieved in the layout of the hardware and the configuration of the computer. As discussed above, the motherboard systems of the prior art were designed to be located in a single area of the computer whereby restricting the shape and design of the computer housing. In contrast, in the subject invention, each support module may be physically separated from any other support module. Utilizing the coupling means, all the motherboards may still be linked to define a composite motherboard even though the support modules are physically separated. To achieve this result, the coupling means can be configured to include an elongated, flexible, ribbon-like cable, joining the female connectors of the coupling means. The coupling means may then be extended between the support modules to link the motherboards.

In addition to achieving greater design flexibility by permitting support modules to be physically separated, the problems associated with heat generation are reduced. More particularly, in the prior art, the clustered arrangement of the printed circuit boards caused heat to be concentrated in one area resulting in component breakdown. In the subject system, the support modules and the printed circuit boards can be physically separated thereby reducing heat concentrations and facilitating cooling.

Another advantage of the subject invention relates to the simplification or reduction of a computer system. More specifically, in certain applications, the manufacturer of a particular computer will wish to sell a streamlined version with reduced computing power at correspondingly lower costs. In a computer utilizing the modular system of the subject invention, the desired number of printed circuit boards can be withdrawn from the computer and the associated support module can simply be removed. The remaining support modules can be operated on their power supplies with their own cooling system such that there is no need to redesign these systems thereby minimizing the costs of the design reduction.

Further objects in advantages of the subject invention will become apparent from the following detailed description when taken in conjunction with the drawings in which:

BRIEF DESCRIPTION OF THE DRAWINGS

FIG. 2 is a perspective view taken from the bottom of the new and improved modular system of the subject invention.

FIG. 3 is a top plan view illustrating a representative example of a motherboard of the subject invention.

FIG. 4 is a perspective view of an alternate embodiment of the coupling means of the subject invention.

DESCRIPTION OF THE PREFERRED EMBODIMENTS

Figure 1:
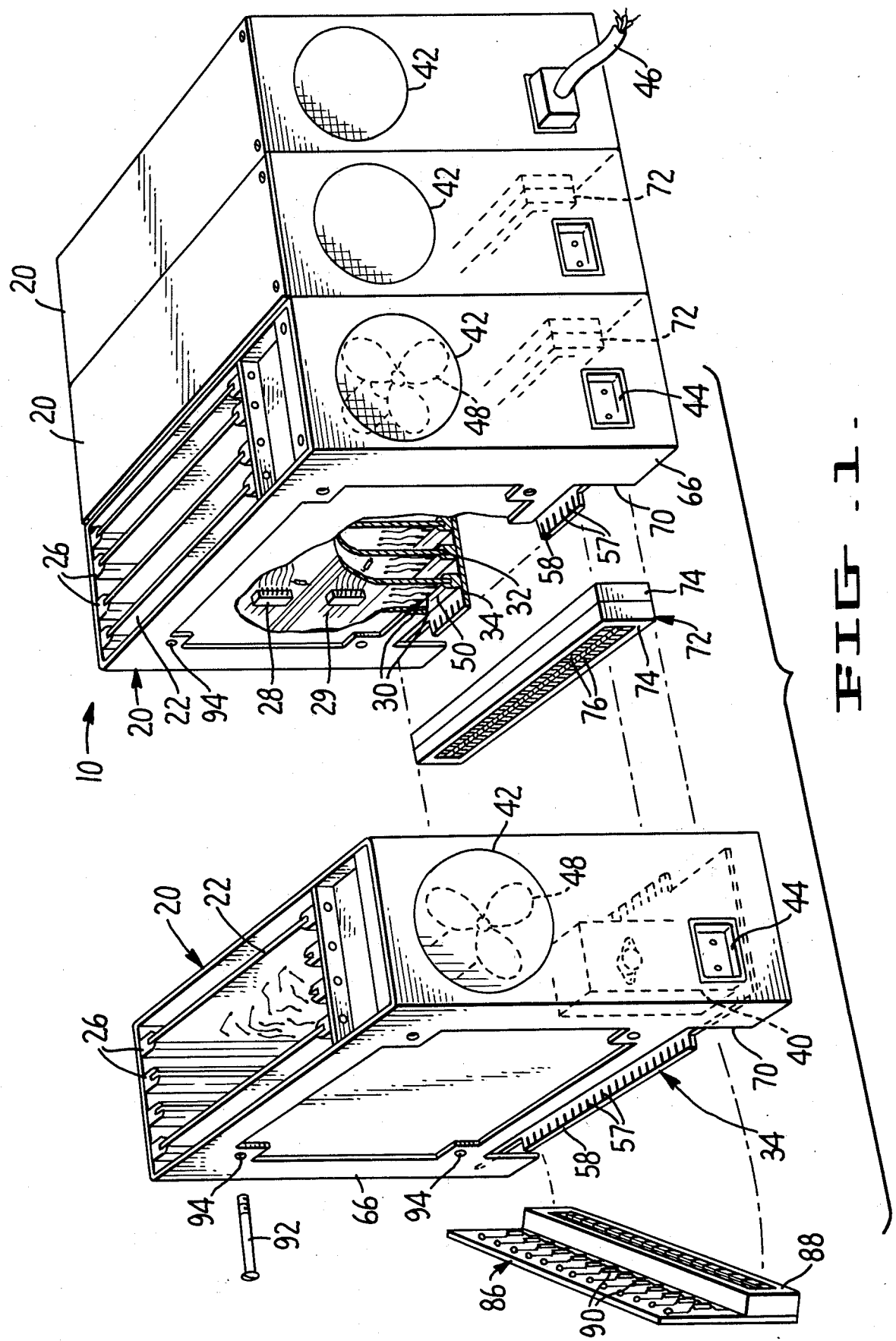
FIG. 1 is an exploded perspective view, partially in section, of the new and improved modular system of the subject invention.

Referring to FIGS. 1-3, there is illustrated the new and improved modular system 10 of the subject invention. The subject system 10 is capable of linking any number of printed circuit boards to a composite motherboard. The motherboard serves as a common connection for transmitting signals to the printed circuit boards.

As illustrated in FIGS. 1 and 2, the subject system 10 includes a plurality of support modules 20. Each support module 20 is defined by a generally rectangular housing adapted to hold a fixed number of printed circuit boards 22. The housing may be formed intregrally or assembled from individual parts. The housing or card cage 20 is preferably made from metal or any other material having sufficient strength.

As illustrated in FIG. 1, housing 20 includes a plurality of card guides or tracks 26 for slidably receiving the printed circuit boards 22. Preferably, the printed circuit boards 22 are mounted in a spaced, parallel array. Various components, such as integrated circuits 28, are mounted on each printed circuit board 22 and provide the hardware of the computing system. Through well known etching procedures, conductive pathways 29 are placed on the printed circuit boards to link the components. One side edge of each printed circuit board 22 includes a plurality of conductive elements 30 which are arranged in a parallel, comb-like array. Each comb-like array defines a male connector 32 adapted to be interfaced with a female connector provided on the motherboard 34, as described more fully herein below.

In accordance with the subject invention, each support module 20 is provided with its own power supply 40 and cooling system 42. The power supply and cooling systems may be mounted in any convenient manner. In the illustrated embodiment, the power supply and cooling systems are mounted adjacent one end of the support module 20. Power supply 40 includes an interface connector 44 which is coupled to a power cable 46. Cooling system 42 may be provided with a fan 48 for establishing a laminar air flow about the printed circuit boards 22 for dissipating the heat generated by the components mounted thereon.

In accordance with the subject invention, each support module 20 is provided with a motherboard 34 serving as a common connection for all the printed circuit boards 22 of the module. As more particularly illustrated in FIG. 3, each motherboard 34 has a generally rectangular planar configuration. Each motherboard 34 is provided with a plurality of female connectors 50 adapted to mate with the comb-like male connectors 32 of the printed circuit boards 22. The female connectors 50 are aligned in a parallel array corresponding to the spacing between the printed circuit boards.

Each famale connector 50 is provided with a plurality of opposed, spring-like conductive contacts 52 for establishing electrical connection with the conductive elements 30 of the printed circuit boards. As illustrated in FIG. 3, a plurality of conductive pathways 54 may be provided on the motherboard for interconnecting various terminals of one connector 50 to the terminals of another connector. It is to be understood that the conductive pathways depicted in FIG. 3 are merely illustrative and are not to be viewed as limiting the scope subject invention.

In accordance with the subject invention, each side edge of the motherboard includes a plurality of conductive elements 57 spaced apart in a comb-like array, and defining a male electrical connector 58. The conductive elements 57 are electrically coupled to the female connectors 50 along conductive pathways 60. As illustrated in FIG. 3, additional conductive pathways 62 may be provided which extend continuously from one side edge of the motherboard to the other. The latter conductive pathways 62 function as ground planes for the electric circuitry.

As illustrated in FIG. 2, motherboard 34 is mounted along the bottom of each support module 20. Mounting may be accomplished in any convenient manner such as by screws 63 passing through apertures 64 formed in the motherboard and engaged in threaded holes (not shown), in the housing. As illustrated in FIG. 1, preferably the side edges 58 of the motherboard are co-planar with the side walls 66 of the housing. To facilitate the coupling of adjacent motherboards, a generally rectangular window 70 may be provided in the side walls 66 of the housing.

In accordance with the subject invention, a coupling means 72 is provided to interconnect the motherboard of one module to the motherboard of another. Coupling means 72 includes a pair of electrically linked female connectors 74. Each female connector 74 includes a plurality of pairs of resilient conductive contacts 76 adapted to mate with conductive elements 57 of the male connector 58 of the motherboard 34. The outer dimensions of the coupling means 72 are defined to enable the support modules to be mounted together such that the respective side walls 66 thereof are placed in abutting contact while permitting the coupling means to be interfit therebetween, as illustrated in FIGS. 1 and 2. Each pair of conductive contacts 76 of one female connector 74 of a coupling means 72 is electrically linked to an opposed pair of contacts in the other female connector. This link may be made in any suitable manner however, preferably, each pair of interconnected contacts is formed as a integral unit to minimize signal loss.

As in the prior art, when utilizing the modular system 10 of the subject invention, the logic circuitry of the computer is developed based on the intended usage of the device. Thereafter, the hardware is designed and laid out on a plurality of printed circuit boards 22. For the purposes of discussion, consider that twelve printed circuit boards are necessary to complete the design circuitry. In the illustrated embodiment, four printed circuit boards may be mounted within each support module 20. Accordingly, it would require three support modules 20 to hold the twelve printed circuit boards. Each support module 20 includes one motherboard 34 having female connectors 50 adapted to mate with the male connectors 32 of the printed circuit boards 22.

After each module 20 has been assembled, they are electrically linked in series, utilizing the coupling means 72 of the subject invention. More particularly, and as illustrated in FIG. 2, a coupling means 72 is interfit between each support module 20 such that the coupling means 72 functions to link the motherboard 34 of one support module 20 to the motherboard of the adjacent support module. A composite motherboard configuration is defined including the three motherboards of the three support modules linked in series.

One free end 80 of the composite motherboard (located on the right hand side of FIG. 2) is connectable to the input/output devices of the computer. Flexible wire cables 82 may be provided to make this connection. The opposed free end 84 of the composite motherboard must be electrically terminated. Accordingly, a termination board 86 is provided having a female connector means 88 adapted to mate with a male connector 58 of a motherboard. The termination board 86 will generally include components such as pull-up resistors 90 for terminating the circuit.

In one embodiment of the subject invention, adjacent modules 20 are fixably mounted in abutting relationship to reduce space requirements and prevent the degredation of the electrical connections therebetween due to vibration or other causes. The modules may be physically joined by any suitable means such as bolts 92 extend through aligned apertures 94 in the side walls 66 of adjacent modules.

As discussed above, after the computer system has been in use in the field for a period of time, the manufacturer will receive suggestions for improving the functioning of the computer. Frequently, these changes will require the addition of extra printed circuit boards to the system. In the prior art, the addition of printed circuit boards to a system would require the redesign of the motherboard as well as the power supply and cooling systems. In contrast, when using the modular system of the subject invention, it is merely necessary to add on another support module 20 to expand the capabilities of the system.

Referring to the above example, wherein the initial computer system was designed with a fixed number of printed circuit boards 52, the additional circuitry needed to implement the desired functional changes may increase the number of printed circuit boards needed. In accordance with the subject invention, another support module may be used to permit the expansion of the system. More specifically, and as illustrated in FIG. 1, a fourth support module 20 is provided with the additional printed circuit boards 22 mounted therein. In changing from the configuration shown in FIG. 2, termination board 86 is first removed from the associated support module 20. The motherboard 34 of the new support module is then linked to original system via coupling means 72. Termination board 86 may then be mounted to the remaining free end of the motherboard of the new support module. By this arrangement, a composite motherboard is defined consisting of four individual motherboards 34.

In accordance with the subject invention, each support module 20 is provided with its own power supply 40 and cooling systems 42. Therefore, the addition of the new module does not involve any redesigning of the previously used power supplies and cooling systems since each system is self-contained and sufficient for each module. Thus, the originally designed system can be readily expanded without incurring major design or refabrication expenditures.

The modular system 10 of the subject invention may also be utilized to minimize heat generation problems as well as for enhancing the design flexibility of the configuration of the computer system. More particularly, support modules 20 need not be centralized in one specific location in the computer as required in the prior art. Rather, each support module 20 may be spaced apart and located at a convenient spot in the computer. By this arrangement, the heat generated by the components is not concentrated in one particular area, such that the likelihood of component breakdown is reduced. In addition, the shape of the housing of the computer may be varied in accordance with functional, as well as aesthetic needs, since a large block of space need not be devoted purely to the motherboard circuitry.

The above described flexibility can be achieved utilizing an alternate embodiment of the coupling means 172 as more particularly illustrated in FIG. 4. Coupling means 172 includes a pair of electrically linked female connectors 174. As in the first embodiment of the coupling means, each female connector 174 includes a plurality of pairs of resilient, conductive contacts 176. In this embodiment of the coupling means, the link between the pairs of female connectors 174 is provided by an elongated, flat, flexible ribbon-like member 178. The ribbon-like member 178 includes a plurality of discrete wires linking corresponding contacts of each connector 174. The length of member 178 is dictated by the desired physical separation between the modules 120. In use, each module 20 may be placed within the computer in a desired location. The modules 20 may be electrically linked in series utilizing coupling means 172. As in the first embodiment of the subject invention, the combination of the motherboards 34 and the coupling means 172 functions to define a composite motherboard for transmitting electrical signals between the input/output devices and the printed circuit boards 22.

In summary, there is provided a new and improved expandable modular system for electrically linking any number of printed circuit boards to a composite motherboard. The subject system includes a support module or card cage 20 adapted to hold a fixed number of individual printed circuit boards 22. A motherboard 34, having a generally planar configuration, is mounted within the support module and includes means adapted to interface with the printed circuit boards. In addition, one pair of side edges of the motherboard includes a male electrical connector 58 defined by a plurality of conductive elements 57 arranged in a comb-like array. The subject invention further includes a coupling means 72 adapted to link the motherboard of one module to the motherboard of another module. Each coupling means is provided with a pair of electrically linked female connectors 74 configured to mate with the comb-like male connectors 58 of the motherboard.

In use, any number of printed circuit boards 22 may be electrically linked. More particularly, the desired number of printed circuit boards 22 are mounted in a sufficient number of support modules 20. Thereafter, coupling means 72 is utilized to electrically link the motherboards of each module in series, such that the combination of the motherboards and the coupling means defines a composite motherboard serving as a common connection to all the printed circuit boards. Preferably, each support module includes its own power supply 40 and cooling system 42 such that the addition of printed circuit boards to the computer may be readily accomplished without extensive redesign of the supporting components. In one embodiment of the subject invention, the female connectors 174 of coupling means 172 are electrically interconnected via a flexible member 178 which permits the support modules 20 to be physically separated. By this arrangement, the heat generated by the components on the printed circuit boards is not concentrated in one location. Further, the design of the computer housing is not restricted by the requirement of placing all the printed circuit boards in close proximity to one another.

While the subject invention has been described with reference to preferred embodiments, it is to be understood that various changes and modifications can be made therein without varying from the scope and spirit of the subject invention. For example, each support module may be designed to accept any desired number of printed circuit boards. Further, the size and dimensions of each support module can be varied in accordance with the size of the printed circuit boards to be utilized.

What is claimed is:

1. A modular system for electrically interconnecting any number of printed circuit boards to a composite motherboard, the motherboard serving as a common connection for all of the printed circuit boards, said system comprising:

a support module defined by a housing adapted to hold a fixed number of individual printed circuit boards;

a motherboard mounted within the support module, and having a generally planar configuration, said motherboard including a first connector means to facilitate the electrical connection of said fixed number of printed circuit boards thereto, and with each side edge of one opposed pair of side edges of the motherboard including a second electrical connector means; and coupling means adapted to link the motherboard of one module to the motherboard of another module, said coupling means having a pair of electrically interconnected third connector means each configured to mate with the second connector means of the motherboard whereby a plurality of printed circuit boards can be electrically interconnected by mounting the desired number of said printed circuit boards in a sufficient number of support modules and utilizing the coupling means to electrically link the motherboards of each module in series such that the combination of the motherboards and the coupling means defines a composite motherboard serving as a common connection for all the printed circuit boards.

2. A modular system as recited in claim 1 wherein each said support module further includes a cooling means for dissipating heat.

3. A modular system as recited in claim 1 wherein each said support module further includes a power supply of sufficient size to provide current to said fixed number of printed circuit boards.

4. A modular system as recited in claim 1 wherein each said printed circuit board is generally planar with one side edge thereof including a male electrical connector means defined by a plurality of conductive elements formed in an array thereon in a comb-like configuration, and wherein said first connector means of said motherboard includes female connector means adapted to mate with the male connector means of said printed circuit board.

5. A modular system as recited in claim 1 wherein said second connector means of said motherboard is a male connector defined by a plurality of conductive elements formed in an array along the respective side edges of said motherboard in a comb-like configuration.

6. A modular system as recited in claim 5 wherein each third connector means of said coupling means is defined by a female connector adapted to mate with the comb-like male connectors of the motherboard.

7. A modular system as recited in claim 1 further including a means for physically connecting a plurality of support modules in abutting contact.

8. A modular system as recited in claim 1 wherein said pair of third connector means of said coupling means are electrically interconnected via a flexible, ribbon-like member permitting said support modules to be physically separated.

9. A modular system for electrically interconnecting any number of printed circuit boards to a composite motherboard, the motherboard serving as a common connection for all of the printed circuit boards, said system comprising:

a support module defined by a housing adapted to hold a fixed number of individual printed circuit boards, said support module including a cooling means for dissipating heat and a power supply of sufficient size to provide current to said fixed number of printed circuit boards;

a motherboard mounted within the support module and having a generally planar configuration, said motherboard including a first connector means to facilitate the electrical connection of said fixed number of printed circuit boards thereto, and with each side edge of one opposed pair of side edges of the motherboard including a second electrical connector means, said second connector means being a male connector defined by a plurality of conductive elements formed in a spaced, comb-like array along said pair of side edges; and coupling means adapted to link the motherboard of one module to the motherboard of another module, said coupling means having a pair of electrically interconnected third connector means, each third connector means being defined by a female connector adapted to mate with the male connectors of the motherboard whereby a plurality of printed circuit boards can be electrically interconnected by mounting the desired number of said printed circuit boards in a sufficient number of said support modules and utilizing the coupling means to electrically link the motherboards of each module in series such that the combination of the motherboards and the coupling means defines a composite motherboard serving as a common connection for all the printed circuit boards.

10. A modular system as recited in claim 9 further including a means for physically connecting a plurality of support modules in abutting contact.

11. A modular system as recited in claim 9 wherein said pair of third connector means of said coupling means are electrically interconnected via a flexible ribbon like member permitting said support modules to be physically separated.

* * * * *